United States Patent
Komatsu et al.

(10) Patent No.: US 8,779,929 B2
(45) Date of Patent: Jul. 15, 2014

(54) SEMICONDUCTOR ELEMENT DRIVE DEVICE HAVING A PLURALITY OF PROTECTION CIRCUITS AND OUTPUTTING A PROTECTION OPERATION NOTIFICATION SIGNAL THAT IDENTIFIES WHICH OF THE PROTECTION CIRCUITS DETECTED A PROBLEM

(75) Inventors: Sachiaki Komatsu, Matsumoto (JP); Satoru Motohashi, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 188 days.

(21) Appl. No.: 13/316,230

(22) Filed: Dec. 9, 2011

(65) Prior Publication Data

US 2012/0146782 A1    Jun. 14, 2012

(30) Foreign Application Priority Data

Dec. 14, 2010    (JP) ................................. 2010-277689
Aug. 1, 2011    (JP) ................................. 2011-168512

(51) Int. Cl.
G08B 21/00    (2006.01)

(52) U.S. Cl.
USPC .......... 340/653; 340/584; 340/635; 361/93.1; 361/103; 363/56.03

(58) Field of Classification Search
USPC ......... 340/501, 584, 635, 653; 361/93.1, 103; 363/56.03
See application file for complete search history.

(56) References Cited

U.S. PATENT DOCUMENTS

| 5,115,388 A | 5/1992 | Shigekane |
| 6,459,380 B1 | 10/2002 | Watanabe et al. |
| 7,868,773 B2 * | 1/2011 | Honda et al. ................... 340/593 |
| 2002/0039269 A1 | 4/2002 | Kumagai et al. |
| 2003/0218891 A1 * | 11/2003 | Liu .............................. 363/56.03 |
| 2009/0072984 A1 * | 3/2009 | Cheng et al. ................... 340/653 |

FOREIGN PATENT DOCUMENTS

| JP | 03-247114 A | 11/1991 |
| JP | 07-154986 A | 6/1995 |
| JP | 08-070580 A | 3/1996 |
| JP | 11-017508 A | 1/1999 |
| JP | 2000-341960 A | 12/2000 |
| JP | 2002-027665 A | 1/2002 |
| JP | 2003-088093 A | 3/2003 |
| JP | 2007-082360 A | 3/2007 |
| JP | 2007-324828 A | 12/2007 |

* cited by examiner

Primary Examiner — Nabil Syed
Assistant Examiner — Mark Rushing
(74) Attorney, Agent, or Firm — Rabin & Berdo, P.C.

(57) ABSTRACT

A semiconductor element drive device which individually drives semiconductor elements configuring a power converter includes plural protection circuits which detect information necessary for carrying out a protection operation for the semiconductor elements, an alarm signal output circuit which, having set therein pulse signals with pulse widths differing from one of the plural protection circuits to another, continuously outputs a pulse signal corresponding to a protection circuit, among the plural protection circuits, which has first detected that a protection operation is necessary, as an alarm signal during a period in which it is detected that the protection operation is necessary, and a notification signal output circuit which, when the alarm signal is output from the alarm signal output circuit, outputs one pulse thereof equivalent to the set pulse width as a protection operation notification signal.

15 Claims, 7 Drawing Sheets

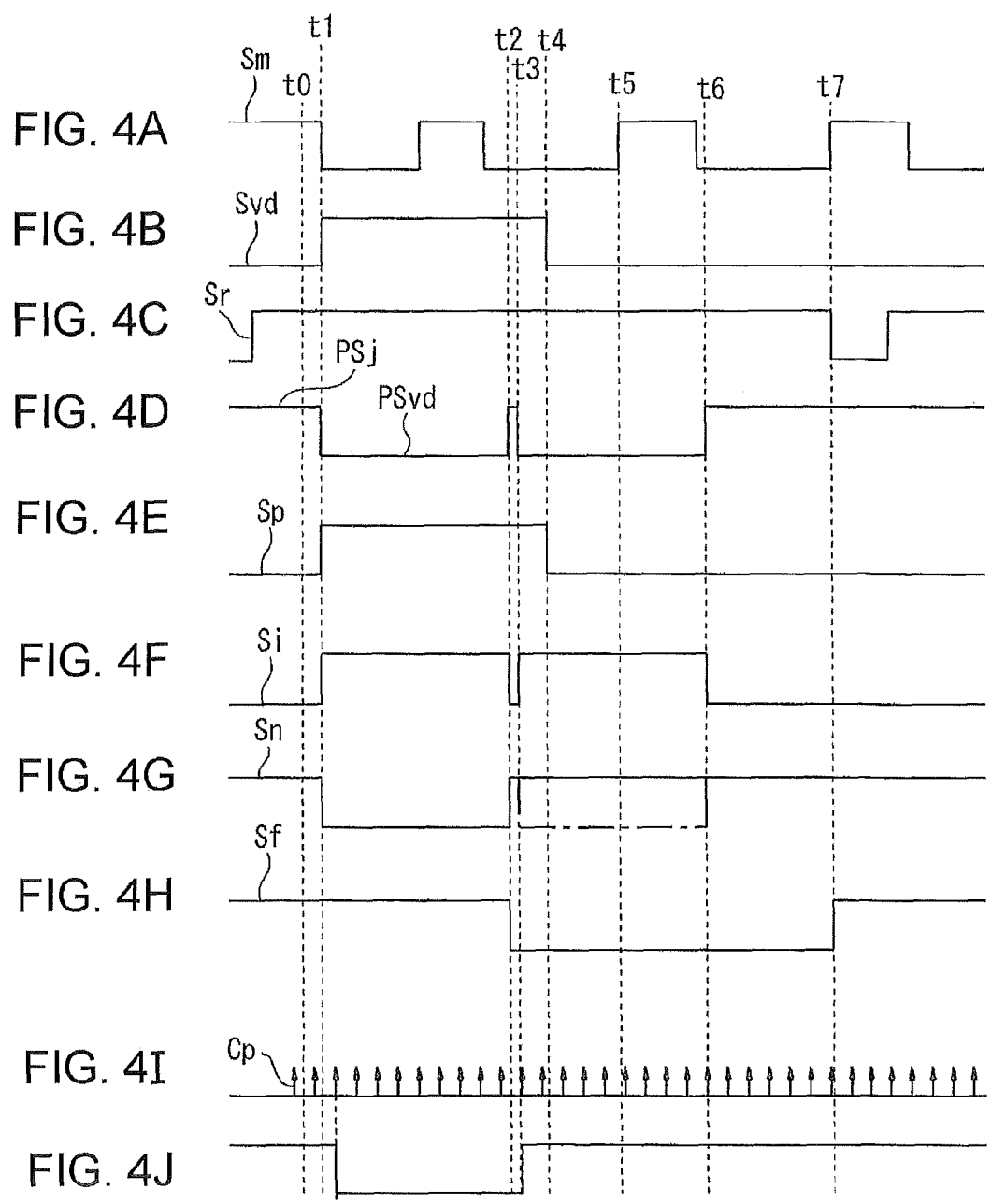

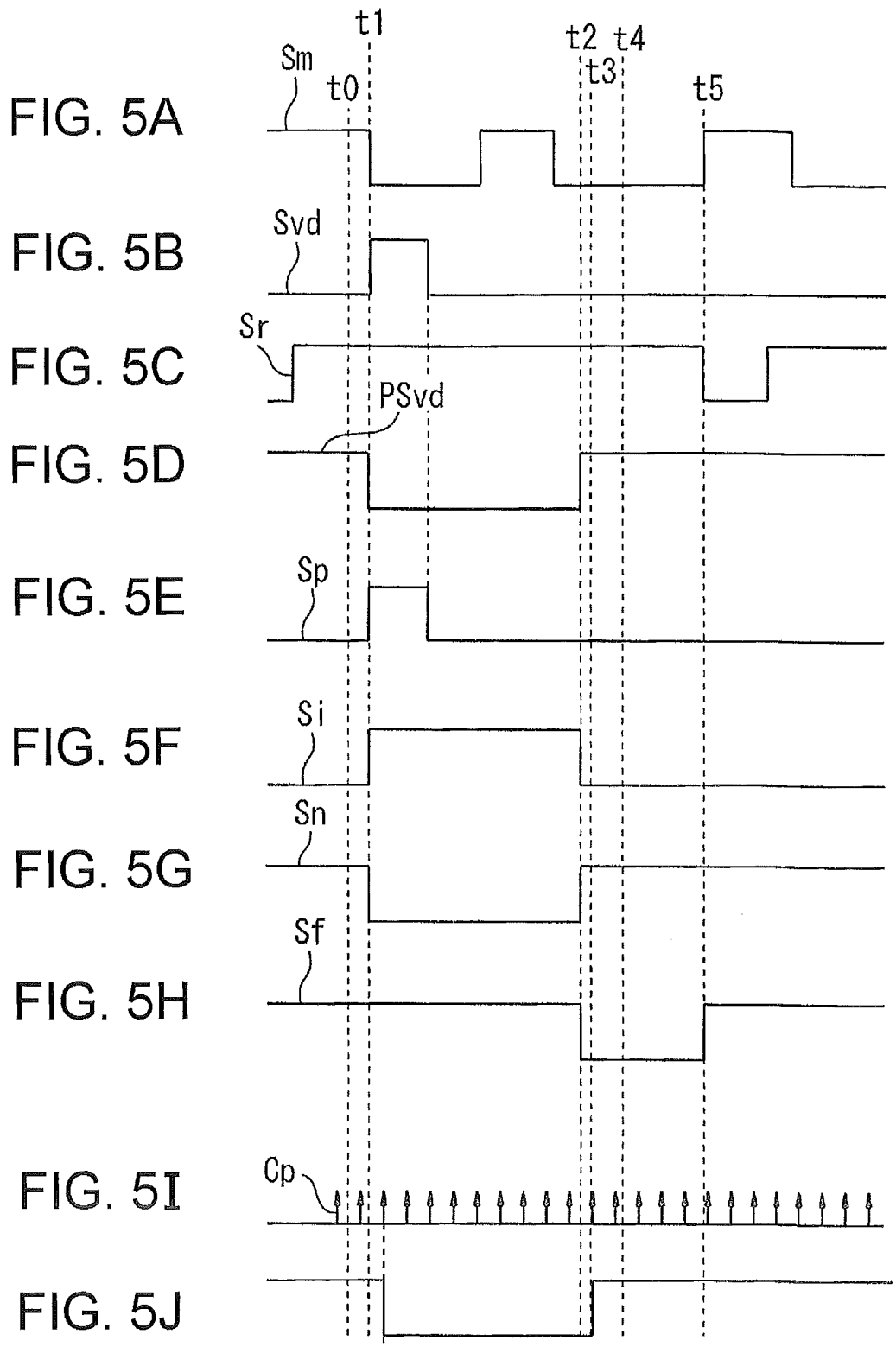

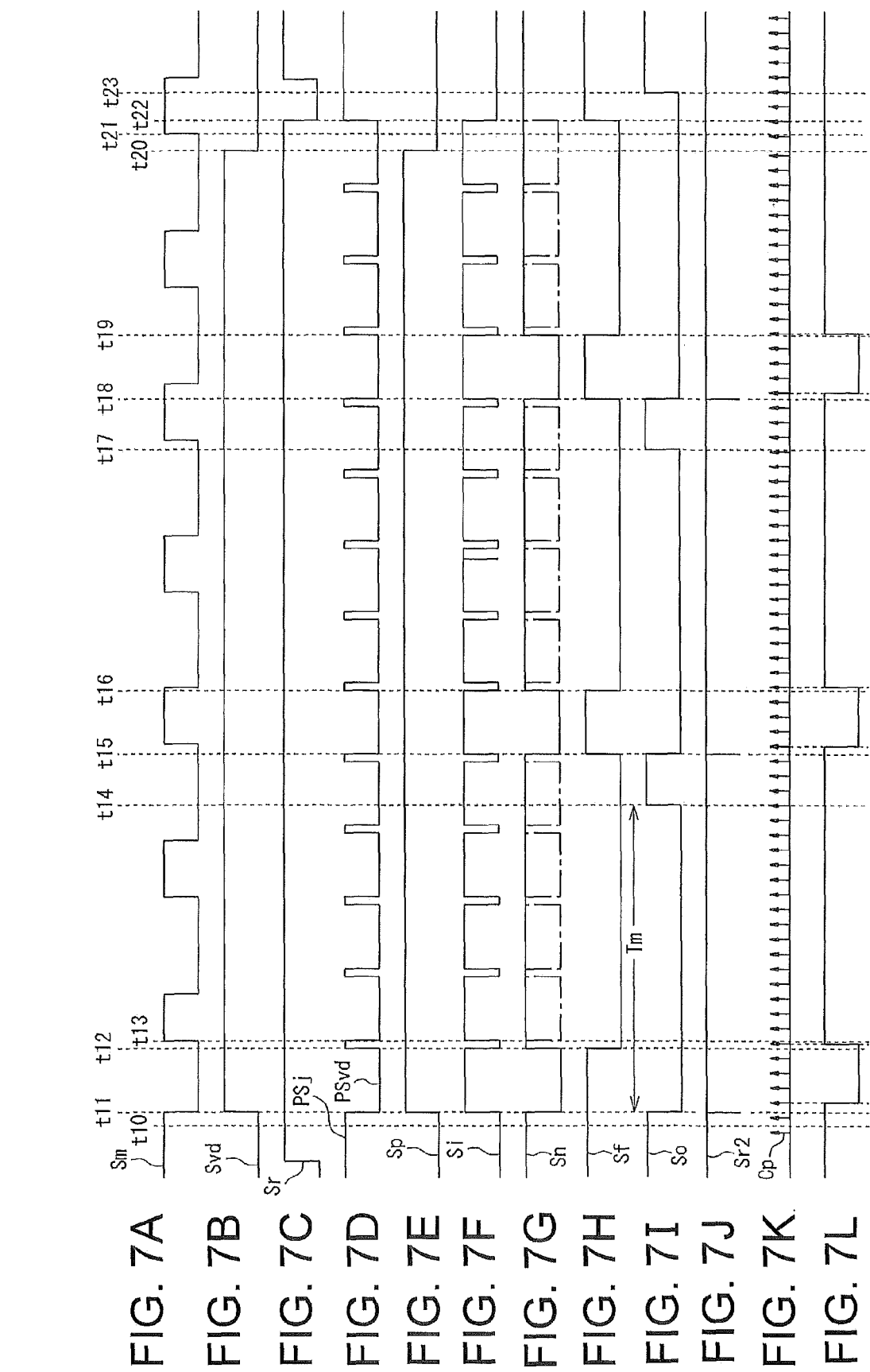

SEMICONDUCTOR ELEMENT DRIVE DEVICE HAVING A PLURALITY OF PROTECTION CIRCUITS AND OUTPUTTING A PROTECTION OPERATION NOTIFICATION SIGNAL THAT IDENTIFIES WHICH OF THE PROTECTION CIRCUITS DETECTED A PROBLEM

CROSS-REFERENCE TO RELATED APPLICATIONS

This application claims priority under 35 U.S.C. §119 from Japanese Patent Application No. 2010-277689, filed on Dec. 14, 2010, and from Japanese Patent Application No. 2001-168512, filed on Aug. 1, 2011. The entirety of each of the identified applications is incorporated herein by reference.

BACKGROUND OF THE INVENTION

1. Technical Field

The present invention relates to a semiconductor element drive device which, as well as driving a semiconductor element configuring, for example, a power converter, has a function of identifying a protection operation.

2. Related Art

As this kind of semiconductor element drive device, for example, an alarm circuit described in JP-A-08-70580 is known. In this heretofore known example described in JP-A-08-70580, an intelligent power module (IPM), which is a power transistor module driving an inverter, includes an overcurrent alarm unit, an overvoltage alarm unit, and an overheat alarm unit.

In the heretofore known example described in JP-A-08-70580, the overcurrent alarm unit is configured to output a first alarm signal having a first pulse width when detecting an overcurrent condition of a power transistor. Also, the overvoltage alarm unit is configured to detect an overvoltage condition of an output terminal of the power transistor and output a second alarm signal having a second pulse width. Furthermore, the overheat alarm unit is configured to detect an overheat condition of the power transistor and output a third alarm signal having a third pulse width. For this reason, simply by detecting the pulse width of the output alarm signal, it is possible to easily determine whether the power transistor is in the overcurrent condition, overvoltage condition, or overheat condition.

Also, as another semiconductor element drive device, an intelligent power module shown in JP-A-2002-27665 is proposed. In this heretofore known example described in JP-A-2002-27665, the intelligent power module includes a required number of semiconductor switching elements, a drive circuit, and various kinds of detection circuit and warning circuit which detect a fatal anomaly and precursory anomaly of the switching elements, drive circuit, or the like. Also, in the heretofore known example described in JP-A-2002-27665, the intelligent power module includes an anomaly detection logic which carries out a switching element protection operation at a time of the anomaly detection by the detection circuits and warning circuits, a control circuit for outputting a signal based on an anomaly detection signal to the exterior, and a transmission circuit.

In the heretofore known example described in JPA-2002-27665, an output terminal from which an alarm signal is output when detecting the fatal anomaly, and an output terminal from which is output an anomaly factor identification signal indicating an anomaly factor including the fatal anomaly and precursory anomaly, are provided in the transmission circuit, and preferably, a configuration is such as to share them as a single output terminal.

Furthermore, as another semiconductor element drive device, an intelligent power module described in JPA-2000-341960 is proposed. In this heretofore known example described in JP-A-2000-341960, the intelligent power module includes IGBT's configuring a power conversion bridge circuit of an inverter, a semiconductor device integrally housing an IGBT 1DB, which interrupts a current consuming the generative power of a motor via a resistor, and a predriver incorporating a drive circuit and protection circuit of a corresponding IGBT. Then, the protection circuit, when there is an anomaly, outputs an alarm ALM1 to the exterior of the intelligent power module via an alarm enable line. However, the protection circuit determines that there is a sign of an occurrence of an anomaly, at a point at which a collector current of an IGBT or a chip temperature is higher than when normal and exceeds a predetermined value lower than a level when issuing the alarm ALM1, before outputting the alarm ALM1. A configuration is such that, when it is determined that there is a sign of an occurrence of an anomaly, an advance alarm ALM2 is output to the exterior of the intelligent power module via an advance alarm line without the IGBT being cut off.

Also, a semiconductor element drive circuit described in JP-A-2007-324828 is proposed. In this heretofore known example described in JP-A-2007-324828, the semiconductor element drive circuit includes a command unit which generates a control signal of an IGBT, a gate circuit which controls the IGBT, and a monitoring circuit which monitors the principal current or collector voltage of the IGBT. Then, a configuration is such that a protection circuit controls the gate circuit when an output from the monitoring circuit exceeds a predetermined value, and notifies the command unit of an anomaly, a count circuit receives the anomaly notification from the protection circuit, and counts the number of anomaly notifications, and the command unit, when the number of counts is at least two or more, determines that an anomaly has occurred.

Furthermore, an electric motor drive control device described in JP-A-2007-82360 is proposed. In this heretofore known example described in JP-A-2007-82360, the electric motor drive control device includes a main circuit which converts direct current power to alternating current power and drives an electric motor which is a load, a driver circuit which drives a power semiconductor switching element of the main circuit, and a host controller which sends a drive signal to the driver circuit. Then, the driver circuit includes an anomaly sensing circuit and an anomaly information PWM converter which sends a PWM pulse with a duty corresponding to the kind of a sensed anomaly to the host controller as anomaly information.

However, in the heretofore known example described in JP-A-08-70580, the intelligent power module individually detects an overcurrent anomaly, overvoltage anomaly and overheat anomaly of the power transistor configuring the inverter, and outputs first to third alarm signals with differing pulse widths to the exterior. Then, by detecting the pulse width of each alarm signal, it is possible to detect which one of the overcurrent anomaly, overvoltage anomaly, and overheat anomaly an anomaly is. However, in the heretofore known example described in JP-A-08-70580, an overcurrent alarm unit, overvoltage alarm unit, and overheat alarm unit, when detecting the overcurrent anomaly, overvoltage anomaly, and overheat anomaly respectively, function as a one-shot multivibrator, and output one alarm signal with a predetermined pulse width. For this reason, there is an unsolved problem in that, when an alarm signal is output from another alarm unit before the alarm signals are returned simultaneously, or one alarm signal is returned, to an on condition by the plural alarm units, the alarm signal is falsely detected.

Also, in the heretofore known example described in JP-A-2002-27665, there is an unsolved problem in that it is necessary to output two kinds of signal, an alarm signal and an anomaly factor identification signal, resulting in a complicated configuration of a signal formation circuit.

Furthermore, in the heretofore known example described in JP-A-2000-341960, the protection circuit, when there is an anomaly, outputs the alarm ALM1 to the exterior via the alarm enable line. Also, the protection circuit determines that there is a sign of an occurrence of an anomaly, at a point at which the collector current of the IGBT or the chip temperature is higher than when normal and exceeds a predetermined value lower than the level when issuing the alarm ALM1, before outputting the alarm ALM1. Then, a configuration is such that, when it is determined that there is a sign of an occurrence of an anomaly, the IGBT outputs the advance alarm ALM2 to the exterior via the advance alarm line. However, in the heretofore known example described in JP-A-2000-341960, there is an unsolved problem in that, it not being possible to identify the collector current or chip temperature, it is only possible to determine whether there is a condition in which an anomaly has occurred or there is a sign of the anomaly occurrence before that, and it is not possible to identify an anomalous condition.

Also, in the heretofore known example described in JP-A-2007-324828, a configuration is such that, in order to prevent the inverter being stopped by a false signal from the protection circuit, the command unit determines that there is an anomaly when the number of counts, wherein the number of anomaly notifications received from the protection circuit is counted, is two or more, but there is an unsolved problem in that it is not possible to simply identify an anomalous condition.

Furthermore, in the heretofore known example described in JP-A-2007-82360, a configuration is such that a PWM pulse with a duty corresponding to the kind of a sensed anomaly is sent to the host controller as anomaly information, and the pulse width is changed depending on the kind of the sensed anomaly. However, as well as it being difficult to accurately determine the kind of the anomaly with the size of the duty, the PWM pulse is output while the anomaly is continuing, meaning that when the duty ratio becomes higher, the interval between adjacent pulses becomes narrower. For this reason, in the heretofore known example described in JP-A-2007-82360, as a total time of the repeatedly output PWM pulses is measured, there is an unsolved problem in that an error is liable to occur in the measurement of the alarm time, and it is difficult to accurately determine the kind of an anomaly.

SUMMARY OF THE INVENTION

Therefore, the invention, having been contrived focusing on the unsolved problems in the heretofore known examples, has an object of providing a semiconductor element drive device which can accurately determine, based on a pulse width, which one of plural protection circuits is in a protection operation condition.

In order to achieve the object, according to a first aspect of the semiconductor element drive device according to the invention, a semiconductor element drive device which individually drives semiconductor elements configuring a power converter includes plural protection circuits which detect information necessary for carrying out a protection operation for the semiconductor elements. Also, according to the first aspect, the semiconductor element drive device includes an alarm signal output circuit which, having set therein pulse signals with pulse widths differing from one of the plural protection circuits to another, continuously outputs a pulse signal corresponding to a protection circuit, among the plural protection circuits, which has first detected that a protection operation is necessary, as an alarm signal during a period in which it is detected that the protection operation is necessary. Furthermore, according to the first aspect, the semiconductor element drive device includes a notification signal output circuit which, when the alarm signal is output from the alarm signal output circuit, outputs one pulse thereof equivalent to the set pulse width as a protection operation notification signal.

According to this configuration, pulse train signals with pulse widths differing from one of the plural protection circuits to another are set, and a pulse train signal with a pulse width corresponding to a protection circuit which has first detected that a protection operation is necessary is output from the alarm signal output circuit. This alarm signal is supplied to the notification signal output circuit, and a protection operation notification signal equivalent to one pulse of the pulse signal with the pulse width corresponding to the protection circuit is output. For this reason, it is sufficient that an external device which has received the protection operation notification signal receives the protection operation notification signal and measures an integrated time corresponding to the pulse width thereof, and it is possible to suppress an occurrence of a measuring error.

Also, according to a second aspect of the semiconductor element drive device according to the invention, the notification signal output circuit includes a NAND gate and an RS type flip-flop circuit. Also, according to the second aspect, the notification signal output circuit inputs the alarm signal from the alarm signal output circuit into one input side of the NAND gate via a logic inverting circuit. Then, the notification signal output circuit, as well as outputting an output from the NAND gate to an external output terminal, inputs the output into an inverting set terminal of the RS type flip-flop circuit via the logic inverting circuit, thus supplying an inverting output from the RS type flip-flop circuit to the other input side of the NAND gate.

According to this configuration, it is possible to configure the notification signal output circuit of the NAND gate and RS type flip-flop circuit, and it is possible to accurately form one pulse's worth of notification signal with a simple configuration.

Also, according to a third aspect of the semiconductor element drive device according to the invention, the alarm signal output circuit is configured in such a way as to output a protection signal which causes a protection operation for the semiconductor element when the alarm signal is output. Then, according to the third aspect, the alarm signal output circuit includes a reset circuit which resets the RS type flip-flop circuit of the notification signal output circuit when the protection signal output from the alarm signal output circuit is stopped, and an operation signal for the relevant semiconductor element is in an on condition.

According to this configuration, the anomaly detection by the protection circuit finishes, and when the protection signal output from the alarm signal output circuit is stopped, and the operation signal for the semiconductor element is in the on condition, the RS type flip-flop circuit is reset by the reset circuit, thereby enabling another output of the notification signal.

Furthermore, according to a fourth aspect of the semiconductor element drive device according to the invention, the protection circuits include at least a temperature detection circuit which detects the temperature of the semiconductor elements, an overcurrent detection circuit which detects an overcurrent of the semiconductor elements, and a control voltage detection circuit which detects a control voltage.

According to this configuration, it is possible to detect an overheat condition, overcurrent condition, and control voltage drop condition of a semiconductor element, and detect a condition in which a protection operation is necessary for the semiconductor element, with the protection circuits.

Also, according to a fifth aspect of the semiconductor element drive device according to the invention, a semiconductor element drive device which individually drives semiconductor elements configuring a power converter includes plural protection circuits which detect information necessary for carrying out a protection operation for the semiconductor elements. Also, according to the fifth aspect, the semiconductor element drive circuit includes an alarm signal output circuit which, having set therein pulse signals with pulse widths differing from one of the plural protection circuits to another, continuously outputs a pulse signal corresponding to a protection circuit, among the plural protection circuits, which has first detected that a protection operation is necessary, as an alarm signal during a period in which it is detected that the protection operation is necessary. Furthermore, according to the fifth aspect, the semiconductor element drive device includes a notification signal output circuit which, when the alarm signal is output from the alarm signal output circuit, outputs one pulse thereof equivalent to the set pulse width as a protection operation notification signal, plural times, maintaining a predetermined interval.

According to this configuration, when the alarm signal is output from the alarm signal output circuit, one pulse thereof equivalent to the set pulse width is output as the protection operation notification signal, plural times, maintaining the predetermined interval, meaning that it is possible to make an accurate notification without falsely determining that there is a protection operation notification signal.

Also, according to a sixth aspect of the semiconductor element drive device according to the invention, the notification signal output circuit includes a NAND gate and an RS type flip-flop circuit. Also, according to the sixth aspect, the notification signal output circuit inputs the alarm signal from the alarm signal output circuit into one input side of the NAND gate via a logic inverting circuit. Then, the notification signal output circuit, as well as outputting an output from the NAND gate to an external output terminal, inputs the output into an inverting set terminal of the RS type flip-flop circuit via the logic inverting circuit, thus supplying an inverting output from the RS type flip-flop circuit to the other input side of the NAND gate.

According to this configuration, it is possible to configure the notification signal output circuit of the NAND gate and RS type flip-flop circuit, and it is possible to accurately form one pulse's worth of notification signal with a simple configuration.

Also, according to a seventh aspect of the semiconductor element drive device according to the invention, the alarm signal output circuit is configured in such a way as to output a protection signal which causes a protection operation for the semiconductor element when the alarm signal is output. Then, according to the seventh aspect, the alarm signal output circuit includes a reset signal formation circuit which resets the RS type flip-flop circuit of the notification signal output circuit when the protection signal output from the alarm signal output circuit is stopped, and an operation signal for the relevant semiconductor element is in an on condition, and a protection operation notification continuation circuit which resets the RS type flip-flop circuit immediately before one pulse's worth of rise of the alarm signal at predetermined time intervals.

According to this configuration, by the RS type flip-flop circuit being reset by the protection operation notification continuation circuit immediately before one pulse's worth of rise of the alarm signal at the predetermined intervals, it is possible to output one pulse's worth of protection operation notification signal, plural times, maintaining the predetermined intervals.

According to the invention, when the semiconductor element drive device which individually drives the semiconductor elements configuring the power converter is provided with the plural protection circuits which detect the information necessary for carrying out a protection operation for the semiconductor elements, pulse signals set to have pulse widths differing from one of the plural protection circuits to another are prevented from being output at the same time. For this reason, it is possible to obtain an advantage in that it is possible to accurately identify a protection circuit with the pulse width of a pulse signal, and that it is possible to prevent a false detection of a protection operation condition.

Also, one pulse corresponding to the pulse width of an anomalous pulse signal among continuous pulse signals output from the pulse signal output circuit is output as the notification signal by the notification signal output circuit, meaning that there is no need to detect a total time of plural pulses, and it is possible to accurately detect an integrated time corresponding to the pulse width.

Furthermore, one pulse's worth of notification signal corresponding to the pulse width of an anomalous pulse signal among continuous pulse signals output from the pulse signal output circuit is output by the notification signal output circuit, plural times, maintaining predetermined intervals, meaning that it is possible to reliably carry out a protection operation notification to the exterior without falsely determining that there is an operation notification signal.

BRIEF DESCRIPTION OF THE DRAWINGS

FIGS. 4A to 4J are signal waveform diagrams for illustrating an operation of the first embodiment;

FIGS. 5A to 5J are signal waveform diagrams for illustrating another operation of the first embodiment;

FIGS. 7A to 7L are signal waveform diagrams for illustrating an operation of the second embodiment.

DETAILED DESCRIPTION OF THE INVENTION

Hereafter, a description will be given of embodiments of the invention, based on the drawings.

Figure 1:
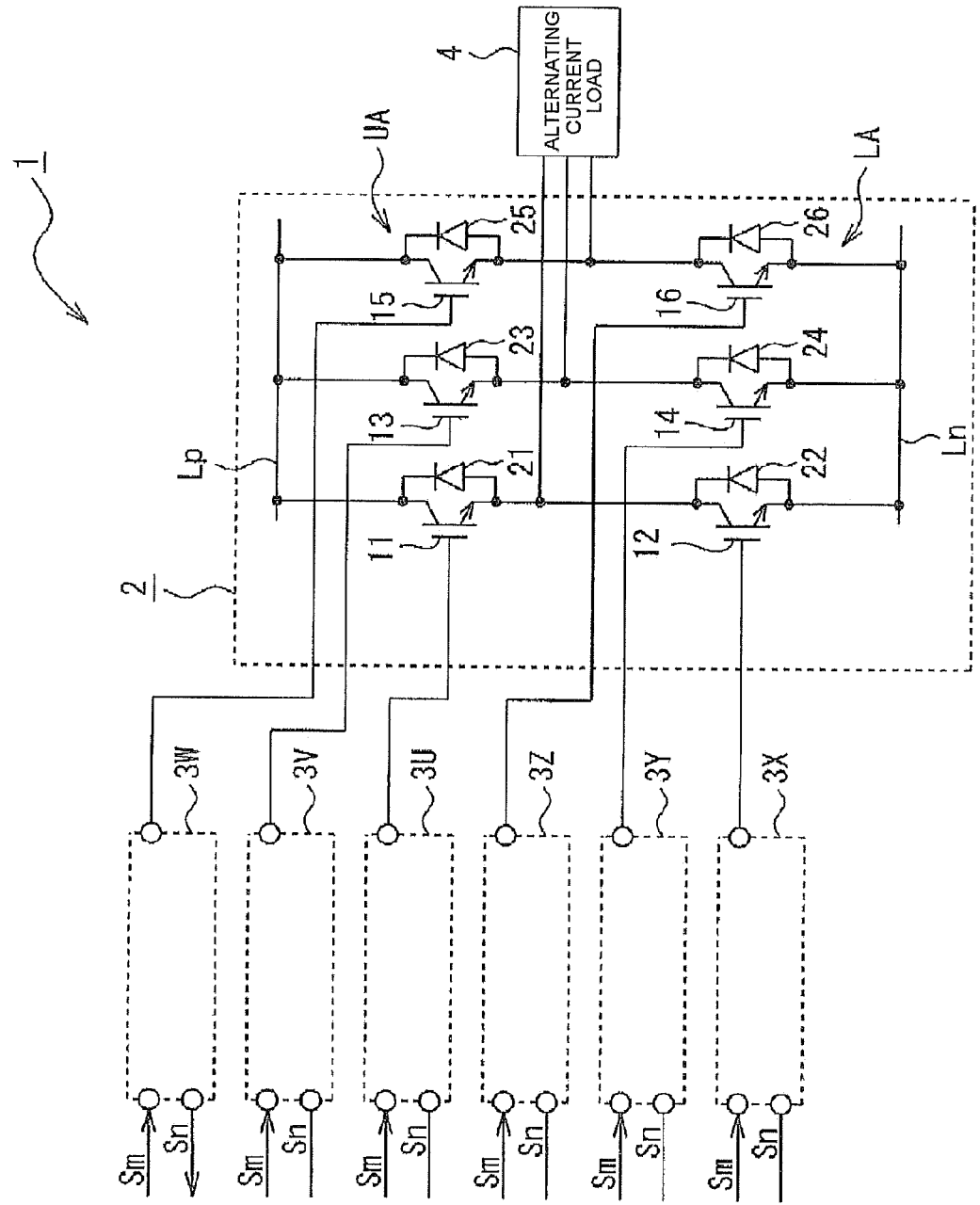
FIG. 1 is a circuit diagram showing a power converter to which the invention can be applied.

FIG. 1 is a block diagram showing a power converter to which the invention can be applied. In FIG. 1, a power converter 1 includes an inverter 2 which converts direct current power into alternating current power, and driver circuits with differing phases 3U to 3Z acting as a semiconductor element drive device which individually drives semiconductor elements with differing phases configuring the inverter 2.

The inverter 2 has insulated gate bipolar transistors (IGBT's) 11 to 16 acting as six semiconductor elements. The IGBT's 11 to 16 are such that a series circuit of the IGBT's 11 and 12, a series circuit of the IGBT's 13 and 14, and a series circuit of the IGBT's 15 and 16 are each connected in parallel between a cathode side line Lp and anode side line Ln connected to a direct current power supply and supplied with direct current power. Herein, free-wheel diodes 21 to 26 are connected in inverse parallel to the IGBT's 11 to 16 respectively.

Also, an upper arm UA is configured by setting the IGBT's 11, 13, and 15 to be of a U phase, V phase, and W phase respectively. Also, a lower arm LA is configured by setting the IGBT's 12, 14, and 16 to be of an X phase, Y phase, and Z phase respectively. Furthermore, three-phase alternating current power is output from a connection point of the IGBT's 11 and 12, a connection point of the IGBT's 13 and 14, and a connection point of the IGBT's 15 and 16, and the three-phase alternating current power is supplied to an alternating current load 4 such as an electric motor.

Figure 2:
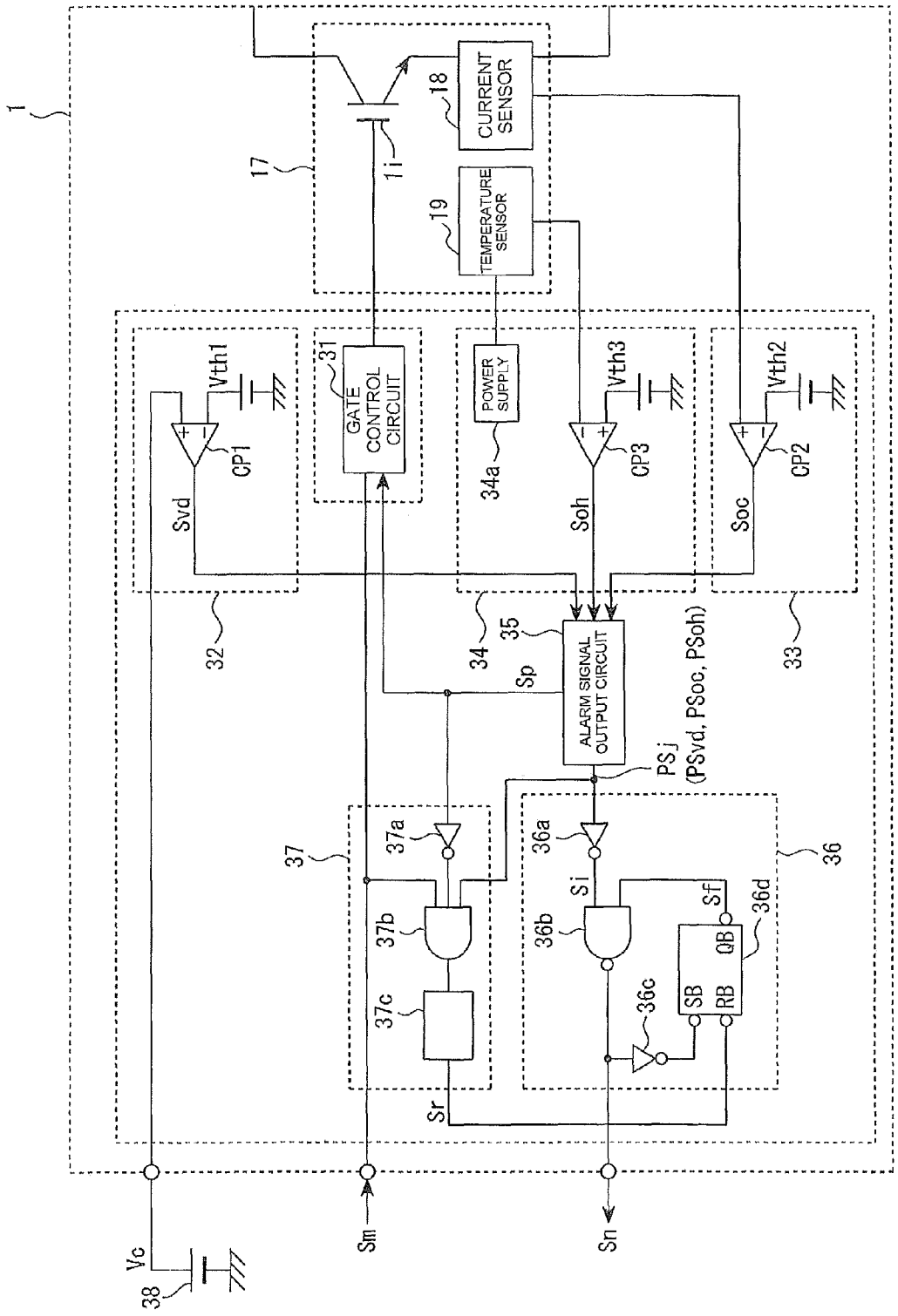
FIG. 2 is a block diagram showing a first embodiment of the invention.

Then, each IGBT 11 to 16 is disposed in a chip 17, as shown in FIG. 2. A current sensor 18 configured of a current sensing IGBT or current sensing resistor which detects a current flowing between the collector and emitter of the IGBT 1$i$ ($i$=one of 1 to 6), and a temperature sensor 19 configured of, for example, a temperature detecting diode, are provided in the chip 17.

Each of driver circuits with differing phases 3U to 3Z, as shown in FIG. 2, includes a gate control circuit 31 which on/off controls the gate of each IGBT 1$i$ configuring the inverter 2, a control voltage detection circuit 32 acting as a protection circuit, an overcurrent detection circuit 33 and chip temperature detection circuit 34, an alarm signal output circuit 35, a notification signal output circuit 36, and a reset pulse formation circuit 37.

As well as a pulse width modulation (PMW) signal being input from the exterior of each driver circuit 3U to 3Z as an operation signal Sm, a protection signal Sp output from the alarm signal output circuit 35 is input into the gate control circuit 31. The gate control circuit 31 outputs the operation signal Sm to the gate of the IGBT 1$i$ when the protection signal Sp is at a low level, and stops the output of the operation signal Sm to the IGBT 1$i$ when the protection signal Sp is at a high level.

The control voltage detection circuit 32 has a comparator CP1 into which, as well as a control voltage Vc being input from an external control power supply 38, a low voltage threshold Vth1 is input. When the control voltage Vc falls below the low voltage threshold Vth1, the comparator CP1 outputs a high-level low voltage detection signal Svd representing a control voltage shortage to the alarm signal output circuit 35.

The overcurrent detection circuit 33 has a comparator CP2 into which, as well as a current detection value output from the current sensor 18 being input, an overcurrent threshold Vth2 is input. When the current detection value exceeds the overcurrent threshold, the comparator CP2 outputs a high-level overcurrent detection signal Soc to the alarm signal output circuit 35.

The chip temperature detection circuit 34 has a comparator CP3 into which, as well as a temperature detection value detected by the temperature sensor 19 being input, an overheat threshold Vht3 is input. When the temperature detection value exceeds the overheat threshold, the comparator CP3 outputs a high-level overheat detection signal Soh representing an overheat condition to the alarm signal output circuit 35. A power supply 34$a$ in the chip temperature detection circuit 34, when the temperature sensor 19 is configured of a temperature detection diode, is for supplying a constant current to this diode.

The low voltage detection signal Svd output from the control voltage detection circuit 32, the overcurrent detection signal Soc output from the overcurrent detection circuit 33, and the overheat detection signal Soh output from the chip temperature detection circuit 34 are input into the alarm signal output circuit 35. When one of the low voltage detection signal Svd, overcurrent detection signal Soc, and overheat detection signal Soh reaches the high level, the alarm signal output circuit 35 outputs the high-level protection signal Sp to the gate control circuit 31 and reset pulse formation circuit 37. Also, the alarm signal output circuit 35 identifies the detection signal, among the detection signals Soc, Soh, and Svd, which has first reached the high level, and outputs a pulse train signal PSj corresponding to the identified detection signal Sj (j=oc, oh, or vd) to the notification signal output circuit 36 as an alarm signal.

Figure 3A:
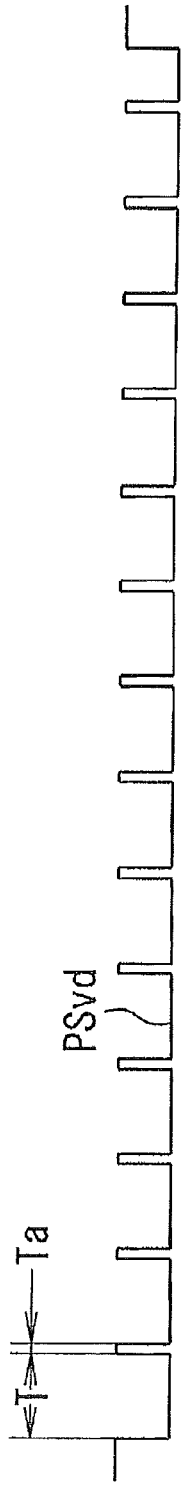
FIGS. 3A to 3C are signal waveform diagrams showing pulse signals output from an alarm signal output circuit of FIG. 2.

Herein, the pulse train signal PSvd is configured of a pulse train signal wherein a pulse width maintaining the low level is, for example, a basic pulse width T, and an interpulse interval is, for example, Ta with a width shorter than the basic pulse width T, as shown in FIG. 3A, when the control voltage detection circuit 32 detects a low voltage of an IC power supply, and the low voltage detection signal Svd is input into the alarm signal output circuit 35. The pulse train signal PSvd is output as the alarm signal while the low voltage detection signal Svd is continuing at the high level. The output of the pulse train signal PSvd is stopped at a point at which the pulse train signal PSvd returns to the high level after the low voltage detection signal Svd has reached the low level.

Figure 3B:
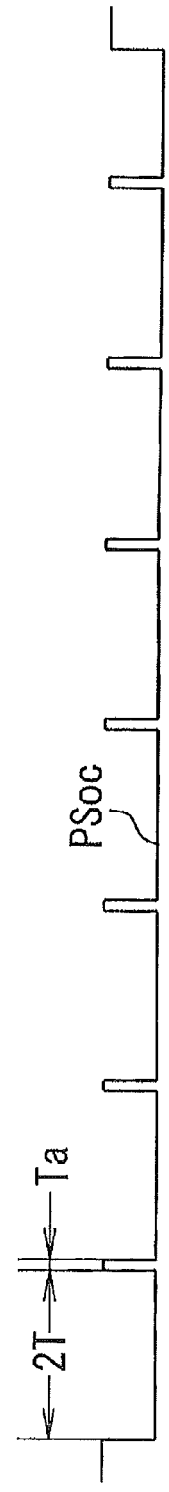

Also, the pulse train signal PSoc is configured of a pulse train signal wherein a low-level pulse width is, for example, 2T and an interpulse interval is Ta, as shown in FIG. 3B, when the overcurrent detection circuit 33 detects an overcurrent condition of the IGBT 1$i$, and the overcurrent detection signal Soc is input into the alarm signal output circuit 35. The pulse train signal PSoc is output as the alarm signal while the overcurrent detection signal Soc is continuing at the high level. The output of the pulse train signal PSoc is stopped at a point at which the pulse train signal PSoc returns to the high level after the low voltage detection signal Svd has reached the low level.

Figure 3C:
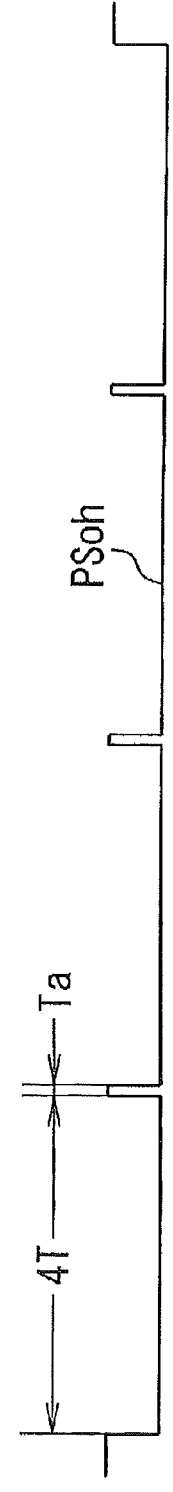

Furthermore, the pulse signal PSoh is configured of a pulse train signal wherein a pulse width is 4T and an interpulse interval is Ta, as shown in FIG. 3C, when the chip temperature detection circuit 34 detects an overheat condition in which the temperature in the chip forming the IGBT 1$i$ becomes equal to or higher than a predetermined overheat threshold, and the overheat detection signal Soh is input into the alarm signal output circuit 35. The pulse train signal PSoh is output as the alarm signal while the overheat detection signal Soh is continuing at the high level. The output of the pulse train signal PSoh is stopped at a point at which the pulse train signal PSoh returns to the high level after the low voltage detection signal Svd has reached the low level.

Also, the protection signal Sp maintains the high level while each detection signal Sj is continuing at the high level.

The notification signal output circuit 36 includes a NAND gate 36$b$ and an RS type flip-flop circuit 36$d$, as shown in FIG. 2. The pulse train signal PSj output from the alarm signal output circuit 35 is input into one input side of the NAND gate 36$b$ via a logic inverting circuit 36$a$. An output signal output from an inverting output terminal QB of the RS type flip-flop circuit 36d is input into the other input side of the NAND gate 36b. An output from the NAND gate 36b is output to the exterior as a protection operation notification signal Sn.

The RS type flip-flop circuit 36d is such that, as well as the protection operation notification signal Sn output from the NAND gate 36b being input into an inverting set terminal SB via a logic inverting circuit 36c, a reset signal Sr from the reset pulse formation circuit 37 is input into an inverting reset terminal RB. Then, an output signal Sf output from the inverting output terminal QB of the RS type flip-flop circuit 36d is input into the other input side of the NAND gate 36b.

The reset pulse formation circuit 37 includes a three-input AND gate 37b and a one-shot circuit 37c supplied with an output from the three-input AND gate 37b. As well as the external operation signal Sm being directly input, the protection signal Sp output from the alarm signal output circuit 35 is input via a logic inverting circuit 37a into the AND gate 37b. Furthermore, the detection signal Sj output from the alarm signal output circuit 35 is input into the AND gate 37b. An output from the AND gate 37b is input into the one-shot circuit 37c. The one-shot circuit 37c switches from the high level to the low level when the output from the AND gate 37b is inverted from the low level to the high level. The one-shot circuit 37c outputs the reset signal Sr, which maintains a low level condition for a comparatively short time and then returns to the high level, to the reset terminal RB of the RS type flip-flop circuit 36d of the notification signal output circuit 36.

Next, a description will be given of an operation of the heretofore described embodiment.

Now, it is assumed that a current flowing through the IGBT's 11 to 16 configuring the inverter 2 is less than the overcurrent threshold and normal, that the temperature in the chip forming each IBGT 11 to 16 is less than the overheat threshold and normal, and furthermore, that an IC power supply voltage supplied to each driver circuit 3U to 3Z exceeds the low voltage threshold and is normal.

In this normal condition, as shown in FIGS. 4A to 4J, at a point t0, the low voltage detection signal Svd output from the control voltage detection circuit 32 of each driver circuit 3U to 3Z, the overcurrent detection signal Soc output from the overcurrent detection circuit 33, and the overheat detection signal Soh output from the chip temperature detection circuit 34 are all at the low level, as shown in FIG. 4B. The alarm signal PSj output from the alarm signal output circuit 35 maintains the high level, as shown in FIG. 4D, and the protection signal Sp also maintains the low level, as shown in FIG. 4E.

At this time, with the reset pulse formation circuit 37, it is assumed that the operation signal input into the gate control circuit 31 from the exterior is at the high level, as shown in FIG. 4A. In this case, as the protection signal Sp output from the alarm signal output circuit 35 maintains the low level, the output from the AND gate 37b maintains the high level. For this reason, the reset signal Sr output from the one-shot circuit 37c maintains the low level, as shown in FIG. 4C.

At this time, with the notification signal output circuit 36, the alarm signal PSj output from the alarm signal output circuit 35 maintains the high level, as shown in FIG. 4D. For this reason, an inverting pulse train signal Si output from the logic inverting circuit 36a maintains the low level, as shown in FIG. 4F. At this time, it is assumed that the RS type flip-flop circuit 36d is in a reset condition, and that the output from the output terminal QB thereof maintains the high level, as shown in FIG. 4H. In this case, the protection operation notification signal Sn output from the NAND gate 36b maintains the high level representing the normal condition, as shown in FIG. 4G.

For this reason, with each driver circuit 3X to 3Z, by a gate signal corresponding to the operation signal input from an external control device (not shown) being supplied to the IGBT's 11 to 16, direct current power is converted into alternating current power by the inverter 2, and the alternating current power is output to the alternating current load 4.

When a low voltage anomaly occurs wherein the IC power supply voltage supplied to the driver circuit 3k (k=one of X to Z) which drives, for example, the X-phase IGBT 1i drops to less than the low voltage threshold from a condition in which the IGBT's 11 to 16 with the differing phases of the inverter 2 are in the normal condition, and the IC power supply voltage is normal, the low voltage anomaly is detected by the control voltage detection circuit 32.

Thereupon, the high-level low voltage detection signal Svd is supplied from the control voltage detection circuit 32 to the alarm signal output circuit 35. For this reason, the pulse train signal PSvd wherein the interpulse interval Ta is set to be smaller than the low-level pulse width T shown in FIG. 3A is output from the alarm signal output circuit 35, as shown in FIG. 4D. At the same time, the protection signal Sp is inverted from the low level to the high level, as shown in FIG. 4E.

For this reason, by the protection signal Sp being supplied to the gate control circuit 31, the output of a gate drive signal from the gate control circuit 31 is stopped, and the drive of the IGBT 1i is stopped.

Also, with the reset pulse formation circuit 37, by the protection signal Sp becoming high level, the output from the AND gate 37b becomes low level, and the reset signal Sr output from the one-shot circuit 37c maintains the high level, as shown in FIG. 4C.

For this reason, the RS type flip-flop circuit 36d of the notification signal output circuit 36 maintains a reset condition, and the output signal Sf therefrom maintains the high level, as shown in FIG. 4H.

However, at a point t1, by the pulse train signal PSvd which is the alarm signal output from the alarm signal output circuit 35 being inverted to the low level, the inverting pulse train signal Si from the logic inverting circuit 36a is inverted to the high level, as shown in FIG. 4F. For this reason, the protection operation notification signal Sn output from the NAND gate 36b is inverted to the low level, as shown in FIG. 4G. At this time, an output from the logic inverting circuit 36c becomes high level but, as the set terminal SB of the RS type flip-flop circuit 36d is made an inverting input, the RS type flip-flop circuit 36d maintains the reset condition without being set.

Subsequently, at a point t2, the pulse train signal PSvd output from the alarm signal output circuit 35 is inverted from the low level to the high level, as shown in FIG. 4D. In response to this, the inverting pulse train signal Si from the logic inverting circuit 36a is inverted from the high level to the low level, as shown in FIG. 4F. For this reason, the protection operation notification signal Sn output from the NAND gate 36b is inverted from the low level to the high level, as shown in FIG. 4G. At this time, the output signal from the logic inverting circuit 36c is inverted from the high level to the low level, and the output signal is supplied to the set terminal SB of the RS type flip-flop circuit 36d as a set signal. Because of this, the RS type flip-flop circuit 36d is set. For this reason, the output signal Sf from the RS type flip-flop circuit 36d is inverted from the high level to the low level, as shown in FIG. 4H.

For this reason, the protection operation notification signal Sn output from the NAND gate 36b is inverted to the high level, as shown in FIG. 4G.

Subsequently, at a point t3, when a pulse train signal PSj output from the alarm signal output circuit 35 is inverted from the high level to the low level, the inverting pulse train signal Si from the logic inverting circuit 36a of the notification signal output circuit 36 is inverted from the low level to the high level, as shown in FIG. 4F. However, the output signal Sf from the RS type flip-flop circuit 36d maintains the low level, as shown in FIG. 4H. For this reason, the protection operation notification signal Sn output from the NAND gate 36b maintains the high level, as shown in FIG. 4G.

Subsequently, at a point t4, when the control voltage Vc of the control power supply 38 returns to a normal voltage higher than the low voltage threshold Vth1, the low voltage detection signal Svd output from the control voltage detection circuit 32 returns from the high level to the low level, as shown in FIG. 4B, in response to which the protection signal Sp output from the alarm signal output circuit 35 also returns from the high level to the low level, as shown in FIG. 4E.

For this reason, a gate drive signal corresponding to the operation signal Sm input from the exterior is output from the gate control circuit 31 to the IGBT 1i, and returns to a normal operation condition.

Subsequently, at a point t5, when the operation signal Sm input from the exterior is inverted to an on condition, the operation signal Sm input into the AND gate 37b of the reset pulse formation circuit 37 and an output signal from the logic inverting circuit 37a become high level, but the alarm signal PSvd output from the alarm signal output circuit 35 maintains the low level, as shown in FIG. 4D. For this reason, the output signal from the AND gate 37b maintains the low level.

Subsequently, at a point t6, by the alarm signal Svd returning to the high level, the output of the alarm signal PSj from the alarm signal output circuit 35 is stopped. For this reason, the alarm signal PSj maintains the high level.

Consequently, subsequently, at a point t7, when the operation signal Sm input from the exterior is inverted to the on condition, the output from the AND gate 37b of the reset pulse formation circuit 37 is inverted from the low level to the high level. In response to this, the reset signal Sr which maintains the low level shown in FIG. 4C for a predetermined time is output from the one-shot circuit 37c to the reset terminal RB of the RS type flip-flop circuit 36d of the notification signal output circuit 36.

As a result of this, the output signal Sf from the RS type flip-flop circuit 36d returns from the low level to the high level, as shown in FIG. 4H. At the point t7, the inverting pulse train signal Si from the logic inverting circuit 36a maintains the low level, as shown in FIG. 4F. For this reason, the protection operation notification signal Sn output from the NAND gate 36b maintains the high level, as shown in FIG. 4G.

Meanwhile, with the external control device, when the protection operation notification signal Sn is input from the driver circuit 3k, clock signals CP shown in FIG. 4I are counted in the low level section shown in FIG. 4J while the protection operation notification signal Sn is maintaining the low level. An integrated time is calculated by multiplying the number of counts by a time between the clock signals, and it is possible to detect from the integrated time that the protection operation notification signal Sn derives from the low voltage detection signal Svd.

At this time, as the protection operation notification signal Sn corresponds to the pulse width of the first one cycle of the pulse train signal PSj output from the alarm signal output circuit 35 of the driver circuit 3k, it is possible to accurately detect an integrated time equivalent to the pulse width. Moreover, as the protection operation notification signal Sn is one signal equivalent to the pulse width of the pulse train signal PSvd corresponding to the low voltage detection signal Svd, and is not a continuous pulse train signal, it does not happen that a counting error occurs even when the interpulse interval Ta of the pulse train signal output from the alarm signal output circuit 35 is narrow, and it is possible to accurately detect the integrated time of the protection operation notification signal Sn.

Also, as a configuration is such as to make a notification of an anomaly when the protection operation notification signal Sn is at the low level, it is possible, when noises are mixed into the protection operation notification signal Sn, to easily determine whether or not there are noises.

Also, when a low voltage condition detected by the control voltage detection circuit 32 is shorter than the first pulse width of the pulse train signal PSj output from the alarm signal output circuit 35, an operation the same as that of FIGS. 4A to 4J is carried out except that only the first one pulse of the pulse train signal PSvd output from the alarm signal output circuit 35 is output, as shown in FIGS. 5A to 5J.

In the same way, when it is detected by the overcurrent detection circuit 33 of a certain driver circuit 3k that a current between the collector and emitter of the IGBT Tli configuring the inverter 2 has become equal to or higher than the overcurrent threshold, the high-level overcurrent detection signal Soc from the overcurrent detection circuit 33 becomes high level. This overcurrent detection signal Soc is supplied to the alarm signal output circuit 35. For this reason, the pulse train signal PSoc shown in FIG. 3B is output from the alarm signal output circuit 35 as the alarm signal. Consequently, the protection operation notification signal Sn corresponding to the pulse width of the low level section of the first one cycle of the pulse train signal PSoc is output from the notification signal output circuit 36 to the external control device. For this reason, with the external control device, as the low-level pulse width of the protection operation notification signal Sn becomes longer, it is possible to recognize that an overcurrent anomaly has occurred. At this time, by the protection signal Sp being output to the gate control circuit 31, the gate drive signal is prohibited from being output to the IGBT 1i.

In the same way, when the temperature in the chip with the built-in IGBT 1i configuring the inverter 2 rises in the chip temperature detection circuit 34 of a certain driver circuit 3k, the high-level overheat detection signal Soh is output by the chip temperature detection circuit 34. Consequently, the pulse train signal PSoh with the comparatively long pulse width shown in FIG. 3C is output from the alarm signal output circuit 35, and supplied to the alarm signal output circuit 35. For this reason, the pulse train signal PSoh shown in FIG. 3C is output from the alarm signal output circuit 35, and the protection operation notification signal Sn corresponding to the pulse width of the low level section of the first one cycle of the pulse train signal PSoh is output from the notification signal output circuit 36 to the external control device. Consequently, with the external control device, as the low-level pulse width of the protection operation notification signal Sn becomes still longer, it is possible to recognize that an overheat anomaly has occurred. At this time, by the protection signal Sp being output to the gate control circuit 31, the gate drive signal is prohibited from being output to the IGBT 1i.

Next, a description will be given of a second embodiment, referring to FIG. 6.

In the second embodiment, as in the first embodiment, a configuration is such as to switch the protection operation notification signal Sn to the low level plural times in accordance with the pulse train signals PSvd, PSoc, and PSoh which are the alarm signals, and make plural protection operation notifications to the external control device.

Figure 6:
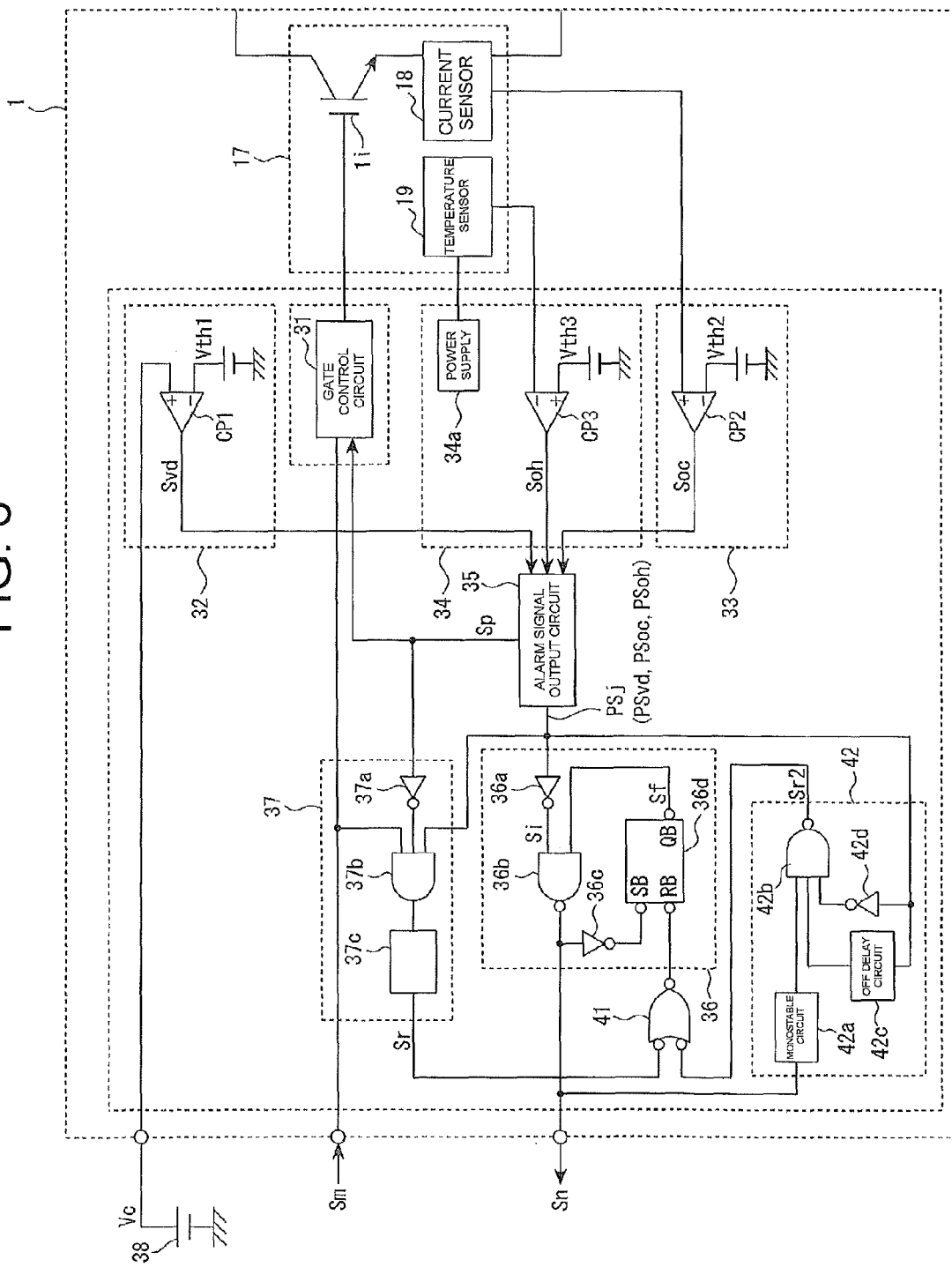
FIG. 6 is a block diagram showing a second embodiment of the invention.

That is, in the second embodiment, as shown in FIG. 6, in the heretofore described configuration of FIG. 2 of the first embodiment, a NOR gate 41 having inverting input terminals is inserted between the reset signal formation circuit 37 and the inverting reset terminal RB of the RS type flip-flop circuit 36d. The reset signal Sr output from the reset signal formation circuit 37 is input into one inverting input side of the NOR gate 41, and a second reset signal Sr2 output from a protection operation notification continuation circuit 42 is input into the other inverting input side.

The protection operation notification continuation circuit 42 includes a monostable circuit 42a and a NAND gate 42b. The protection operation notification signal Sn output from the notification signal output circuit 36 is input into the monostable circuit 42a. The monostable circuit 42a is triggered to switch from the high level to the low level at a point at which the protection operation notification signal Sn is inverted from the high level to the low level. Then, the monostable circuit 42a outputs an output signal So which returns to the high level after maintaining the low level condition for, for example, a predetermined period Tm slightly longer than the previously described one cycle of the longest-cycle pulse train signal PSoh from the alarm signal output circuit 35.

The output signal So output from the monostable circuit 42a is input into the NAND gate 42b. Also, a delay output from an off delay circuit 42c into which is input the pulse train signal PSj output from the alarm signal output circuit 35 is input into an input side of the NAND gate 42b. Herein, the delay time of the off delay circuit 42c is set to the extent that the pulse train signal PSj continues slightly at the high level even after the inverting pulse train signal Si has become high level. Furthermore, an inverting pulse train signal Si the same as the previously described inverting pulse train signal Si, output from the logic inverting circuit 36a of the notification signal output circuit 36, to which the pulse train signal PSj is logically inverted by the logic inverting circuit 42d is input into the input side of the NAND gate 42b.

Then, an output signal output from the NAND gate 42b is supplied to the NOR gate 41 as the second reset signal Sr2.

As other components in the second embodiment have the same configurations as those of FIG. 2 of the first embodiment, portions corresponding to those of FIG. 2 are given identical reference numerals and characters, and a detailed description thereof will be omitted.

Next, a description will be given of an operation of the second embodiment, along with the signal waveform diagrams shown in FIGS. 7A to 7L.

Now, it is assumed that a current flowing through the IGBT's 11 to 16 configuring the inverter 2 is less than the overcurrent threshold and normal, that the temperature in the chip forming each IBGT 11 to 16 is less than the overheat threshold and normal, and furthermore, that the IC power supply voltage supplied to each driver circuit 3U to 3Z exceeds the low voltage threshold and is normal.

In this normal condition, in the same way as in the first embodiment, at a point t10, the low voltage detection signal Svd output from the control voltage detection circuit 32 of each driver circuit 3U to 3Z, the overcurrent detection signal Soc output from the overcurrent detection circuit 33, and the overheat detection signal Soh output from the chip temperature detection circuit 34 are all at the low level, as shown in FIG. 7B, and as well as the alarm signal output from the alarm signal output circuit 35 maintaining the high level, the protection signal Sp also maintains the low level, as shown in FIG. 7E.

At this time, the reset signal Sr output from the reset pulse formation circuit 37 maintains the low level, as shown in FIG. 7C.

At this time, with the notification signal output circuit 36, the alarm signal PSj output from the alarm signal output circuit 35 maintains the high level, as shown in FIG. 7D, and the inverting pulse train signal Si output from the logic inverting circuit 36a maintains the low level, as shown in FIG. 7F. At this time, it is assumed that the RS type flip-flop circuit 36d is in the reset condition, and that the output from the output terminal QB thereof maintains the high level, as shown in FIG. 7H. In this case, the protection operation notification signal Sn output from the NAND gate 36b maintains the high level representing the normal condition, as shown in FIG. 7G.

Also, with the protection operation notification continuation circuit 42, as the protection operation notification signal Sn is at the high level, the monostable circuit 42a is not triggered, and the output signal So therefrom maintains the high level, as shown in FIG. 7I. The pulse train signal PSj output from the alarm signal output circuit 35 also maintains the high level, as shown in FIG. 7D. However, the inverting pulse train signal Si output from the logic inverting circuit 42d maintains the low level. For this reason, the second reset signal Sr2 output from the NAND gate 42b maintains the high level, as shown in FIG. 7J.

Consequently, an output signal from the NOR gate 41 maintains the low level, and is input into the inverting reset terminal RB of the RS type flip-flop circuit 36d. At this time, as the output signal from the NOR gate 41 is not at a time of being inverted from the high level to the low level, the RS type flip-flop circuit 36d maintains the reset condition without changing in condition. Consequently, the output signal Sf output from the output terminal QB of the RS type flip-flop circuit 36d maintains the high level.

At a point t11, when a low voltage anomaly occurs wherein the IC power supply voltage supplied to the driver circuit 3k (k=one of X to Z) which drives, for example, the X-phase IGBT 1i drops to less than the low voltage threshold from the condition in which the IGBT's 11 to 16 with the differing phases of the inverter 2 are in the normal condition, and the IC power supply voltage is normal, the low voltage anomaly is detected by the control voltage detection circuit 32.

Because of this, in the same way as in the first embodiment, the high-level low voltage detection signal Svd is supplied to the alarm signal output circuit 35. For this reason, the pulse train signal PSvd wherein the interpulse interval Ta is set to be smaller than the low-level pulse width T shown in FIG. 3A is output from the alarm signal output circuit 35, as shown in FIG. 7D. At the same time, the protection signal Sp is inverted from the low level to the high level, as shown in FIG. 7E. By the protection signal Sp being supplied to the gate control circuit 31, the output of the gate drive signal from the gate control circuit 31 is stopped and the drive of the IGBT 1i is stopped.

At the point t11, by the pulse train signal PSvd which is the alarm signal output from the alarm signal output circuit 35 being inverted to the low level, the inverting pulse train signal Si output from the logic inverting circuit 36a is inverted to the high level, as shown in FIG. 7F. For this reason, the protection operation notification signal Sn output from the NAND gate 36b is inverted to the low level, as shown in FIG. 7G. At this time, the output from the logic inverting circuit 36c becomes high level, but as the set terminal SB of the RS type flip-flop circuit 36d is made an inverting input, the RS type flip-flop circuit 36d maintains the reset condition without being set.

At this time, with the protection operation notification continuation circuit 42, immediately before the monostable circuit 42a is triggered at the point t11, the output signal from the off delay circuit 42c is at the high level, and the inverting pulse train signal Si output from the logic inverting circuit 42d is inverted from the low level to the high level. For this reason, the second reset signal Sr2 output from the NAND circuit 42b becomes low level for an instant, as shown in FIG. 7J. As the output signal from the NOR gate 41 is inverted from the high level to the low level by the second reset signal Sr2, the RS type flip-flop circuit 36d is reset. However, the RS type flip-flop circuit 36d, as it is originally in the reset condition, maintains the reset condition, and the output signal Sf output from the inverting output terminal QB thereof maintains the high level.

Also, with the protection operation notification continuation circuit 42, by the protection operation notification signal Sn being inverted to the low level, the output signal So from the monostable circuit 42a, by being triggered by the protection operation notification signal Sn, is inverted from the high level to the low level, as shown in FIG. 7I, and this low level condition is maintained for the predetermined period Tm slightly longer than one cycle of the longest-cycle pulse train signal PSoh.

Consequently, the second reset signal Sr2 output from the NAND gate 42b returns to the high level instantaneously, and a reset signal output from the NOR gate 41 also returns to the high level. This high-level reset signal is supplied to the inverting reset terminal RB of the RS type flip-flop circuit 36d, but the RS type flip-flop circuit 36d maintains the reset condition.

Subsequently, at a point t12, the pulse train signal PSvd output from the alarm signal output circuit 35 is inverted from the low level to the high level, as shown in FIG. 7D. In response to this, the inverting pulse train signal Si output from the logic inverting circuit 36a is inverted from the high level to the low level, as shown in FIG. 7F. For this reason, the protection operation notification signal Sn output from the NAND gate 36b is inverted from the low level to the high level, as shown in FIG. 7G.

At this time, the output signal from the logic inverting circuit 36c is inverted from the high level to the low level, and supplied to the set terminal SB of the RS type flip-flop circuit 36d as the set signal. Because of this, the RS type flip-flop circuit 36d is set. For this reason, the output signal Sf from the RS type flip-flop circuit 36d is inverted from the high level to the low level, as shown in FIG. 7H.

At the point t12, the output signal So from the monostable circuit 42a of the protection operation notification continuation circuit 42 continues at the low level, and the second reset signal Sr2 output from the NAND gate 42b continues at the high level, as shown in FIG. 7I. For this reason, the reset signal output from the NOR gate 41 also continues at the high level.

Subsequently, as the output signal Sf from the RS type flip-flop circuit 36d maintains the low level, as shown in FIG. 7H, the protection operation notification signal Sn output from the NAND gate 36b maintains the high level even though the pulse train signal repeats the inversion between the high level and low level. The protection operation notification to the external control device is suppressed.

Subsequently, at a point t14 at which the predetermined period Tm of the monostable circuit 42a of the protection operation notification continuation circuit 42 elapses, the output signal from the monostable circuit 42a returns to the high level. Subsequently, at a point t15, the pulse train signal PSvd is inverted from the high level to the low level, as shown in FIG. 7D, and at the same time, the inverting pulse train signal Si is inverted from the low level to the high level, as shown in FIG. 7F. For this reason, as the high level condition of the pulse train signal PSvd is delayed by the off delay circuit 42c, the second reset signal Sr2 output from the NAND gate 42b becomes low level, as shown in FIG. 7J. For this reason, the reset signal output from the NOR gate 41 becomes low level, and the RS type flip-flop circuit 36d is reset. For this reason, the output signal Sf output from the inverting output terminal QB of the RS type flip-flop circuit 36d is inverted from the low level to the high level, as shown in FIG. 7H.

At the point t15, the inverting pulse train signal Si output from the logic inverting circuit 36a is inverted to the high level, while the protection operation notification signal Sn output from the NAND gate 36b is inverted to the low level, and the external control device is notified of the protection operation condition.

Subsequently, at a point t16, when the inverting pulse train signal Si is inverted to the low level, the protection operation notification signal Sn output from the NAND gate 36b also returns to the high level in response to this. By the protection operation notification signal Sn becoming high level, the RS type flip-flop circuit 36d is set, and the output signal Sf therefrom is inverted to the low level. At the same time, the monostable circuit 42a of the protection operation notification continuation circuit 42 is triggered, the output signal therefrom is inverted to the low level, and the second reset signal Sr2 output from the NAND gate 42b becomes high level. For this reason, the reset signal output from the NOR gate 41 is also inverted to the high level.

Subsequently, each time the low-level second reset signal Sr2 is output from the protection operation notification continuation circuit 42, the protection operation notification signal Sn becomes low level, and the external control device is notified of the protection operation condition.

Also, at a point t20, when the control voltage Vc of the control power supply 38 returns to a normal voltage higher than the low voltage threshold Vth1, in the same way as in the first embodiment, the operation signal Sm is inverted to the high level at a point t21, as shown in FIG. 7A, and subsequently, the pulse train signal PSvd becomes high level at a point t22. For this reason, by the reset signal Sr output from the reset signal formation circuit 37 becoming low level, as shown in FIG. 7C, and the reset signal output from the NOR gate 41 becoming low level, the RS type flip-flop circuit 36d is reset. A condition of receiving the pulse train signal PSj from the alarm signal output circuit 35 is returned to.

In the same way, when it is detected by the overcurrent detection circuit 33 of a certain driver circuit 3k that a current between the collector and emitter of the IGBT 1i configuring the inverter 2 has become equal to or higher than the overcurrent threshold, the high-level overcurrent detection signal Soc from the overcurrent detection circuit 33 becomes high level. This overcurrent detection signal Soc is supplied to the alarm signal output circuit 35. For this reason, the pulse train signal PSoc shown in FIG. 3B is output from the alarm signal output circuit 35 as the alarm signal. Consequently, the protection operation notification signal Sn corresponding to the pulse width of the low level section of the first one cycle of the pulse train signal PSoc is output plural times from the notification signal output circuit 36 to the external control device. For this reason, with the external control device, as the low-level pulse width of the protection operation notification signal Sn becomes longer, it is possible to recognize that an overcurrent anomaly has occurred. At this time, by the protection signal Sp being output to the gate control circuit 31, the gate drive signal is prohibited from being output to the IGBT 1*i*.

In the same way, when the temperature in the chip with the built-in IGBT 1*i* configuring the inverter 2 rises in the chip temperature detection circuit 34 of a certain driver circuit 3*k*, the high-level overheat detection signal Soh is output by the chip temperature detection circuit 34. Consequently, the pulse train signal PSoh with the comparatively long pulse width shown in FIG. 3C is output from the alarm signal output circuit 35, and supplied to the alarm signal output circuit 35. For this reason, the pulse train signal PSoh shown in FIG. 3C is output from the alarm signal output circuit 35, and the protection operation notification signal Sn corresponding to the pulse width of the low level section of the first one cycle of the pulse train signal PSoh is output plural times from the notification signal output circuit 36 to the external control device. Consequently, with the external control device, as the low-level pulse width of the protection operation notification signal Sn becomes still longer, it is possible to recognize that an overheat anomaly has occurred. At this time, by the protection signal Sp being output to the gate control circuit 31, the gate drive signal is prohibited from being output to the IGBT 1*i*.

In this way, according to the second embodiment, while the protection signal Sp is being output from the alarm signal output circuit 35, the protection operation notification based on the pulse train signal PSj is suppressed while the output signal So output from the monostable circuit 42*a* of the protection operation notification continuation circuit 42 is maintaining the low level. Subsequently, at a point at which the inverting pulse train signal Si is inverted from the low level to the high level in the condition in which the output signal So from the monostable circuit 42*a* has returned from the low level to the high level, the protection operation notification signal Sn becomes low level while the inverting pulse train signal Si is maintaining the high level, and it is possible to notify the external control device of the protection operation condition.

At this time, it is not that the protection operation notification signal Sn is continuously inverted to the low level in synchronism with a change of the pulse train signal PSj, but that the external control device is notified of the protection operation notification signal Sn after an interval of the predetermined period Tm set by the monostable circuit 42*a*. For this reason, with the external control device, even when the clock signals CP are counted in the low level section of the protection operation notification signal Sn, the number of counts is multiplied by a time between the clock signals, calculating an integrated time, and it is determined from the integrated time that the protection operation notification signal Sn derives from the low voltage detection signal Svd, it does not happen that an integrated time is miscalculated, and it is possible to accurately carry out the identification of the protection operation notification signal Sn.

Moreover, as the external control device is notified of the protection operation notification signal Sn plural times, it is possible to improve the reliability of transmission of the protection operation notification signal in comparison with the heretofore described one notification in the first embodiment. Also, by switching the protection operation notification signal Sn to the low level plural times, it is possible to expand the use of the protection operation notification signal Sn and ensure general versatility for a demander who cannot be satisfied with the one notification.

In the second embodiment, a description has been given of a case in which the protection operation notification signal continues to be at the low level with a predetermined interval maintained while the pulse train signal PSj is being output from the alarm signal output circuit 35. However, in the second embodiment, the number of times the protection operation notification signal is switched to the low level by the notification signal output circuit 36 can also be limited to a predetermined number of times equal to or more than twice. In this case, it is sufficient to adopt a configuration such that the number of times the protection operation notification signal is switched to the low level is detected by a counter, plural shift registers, or the like, and when the predetermined number of times is reached, the second reset signal Sr2 output from the protection operation notification continuation circuit 42 is stopped.

In the first and second embodiments, a description has been given of a case in which an inverter is applied as a power converter, but the invention, not being limited to this, can also be applied to a converter which converts alternating current power to direct current power, a chopper circuit which raises and drops direct current power, or the like, and can be applied to any other power converter including a semiconductor element. Also, a description has been given of a case in which the invention is applied to a three-phase power converter, but the invention can also be applied to a power converter with four phases or more, or a single-phase power converter.

Also, in the first and second embodiments, a description has been given of a case in which the pulse widths of the pulse train signals PSvd, PSoc, and PSoh generated by the alarm signal output circuit 35 are set to the basic pulse widths T, 2T, and 4T but, not being limited to this, pulse train signals with any pulse widths are applicable, provided that they are differing pulse widths which can be identified by a control device.

Furthermore, in the first and second embodiments, a description has been given of a case in which the pulse train signals PSvd, PSoc, and PSoh output from the alarm signal output circuit 35 are set so as to have differing low-level pulse widths but, not being limited to this, the pulse train signals PSvd, PSoc, and PSoh can also be set so as to have differing high-level pulse widths. In this case, it is sufficient to omit the logic inverting circuit 36*a* of the notification signal output circuit 36.

Also, in the first and second embodiments, a description has been given of a case in which the protection operation notification signal Sn which becomes low level at the time of the protection operation is output from the notification signal output circuit 36, but a configuration may be such as to output the protection operation notification signal Sn which becomes high level at the time of the protection operation.

Also, in the first and second embodiments, a description has been given of a case in which the protection operation notification signals Sn are individually output from the driver circuits 3X to 3Z but, for example, a configuration may be such that the protection operation notification signals Sn output from the driver circuits 3X to 3Z are input to an OR gate in an intelligent power module (IPM), and an output from the OR gate is output to the exterior of the IPM as a protection operation notification signal.

Furthermore, in the first and second embodiments, a description has been given of a case in which an IGBT is applied as a semiconductor element but, not being limited to this, any semiconductor element such as a power FET can be applied.

Furthermore, in the first and second embodiments, a description has been given of a case in which the low voltage of the control power supply, and the overcurrent and overheat of the IGBT, are detected but, not being limited to this, a configuration may be such as to detect two kinds among the above-mentioned three kinds of protection operation, and furthermore, a configuration may be such as to provide an anomaly detection circuit which detects another condition in which a protection operation against overvoltage or the like is necessary.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A semiconductor element drive device which individually drives semiconductor elements configuring a power converter, comprising:
   a plurality of protection circuits which detect information necessary for carrying out a protection operation for the semiconductor elements;
   an alarm signal output circuit which outputs a pulse signal corresponding to a protection circuit, among the plurality of protection circuits, which has first detected that a protection operation is necessary, as an alarm signal during a period in which it is detected that the protection operation is necessary, the pulse signal having a pulse timing that depends on which of the protection circuits has first detected that the protection operation is necessary; and
   a notification signal output circuit which, when the alarm signal is output from the alarm signal output circuit, outputs a protection operation notification signal, having a duration that identifies which of the protection circuits has first detected that the protection operation is necessary,
   wherein the notification signal output circuit applies a logic inverting circuit to the alarm signal.

2. The semiconductor element drive device according to claim 1, wherein the protection circuits include a temperature detection circuit which detects a temperature of the semiconductor elements, and overcurrent detection circuit which detects an overcurrent of the semiconductor elements, and a control voltage detection circuit which detects a control voltage.

3. The semiconductor element drive device according to claim 1, wherein the notification signal output circuit includes a flip-flop, and further comprising a reset circuit that resets the flip-flop.

4. A semiconductor element drive device which individually drives semiconductor elements configuring a power converter, comprising:
   a plurality of protection circuits which detect information necessary for carrying out a protection operation for the semiconductor elements;
   an alarm signal output circuit which outputs a pulse signal corresponding to a protection circuit, among the plurality of protection circuits, which has first detected that the protection operation is necessary, as an alarm signal during a period in which it is detected that the protection operation is necessary, the pulse signal having a pulse timing that depends on which of the protection circuits has first detected that the protection operation is necessary; and
   a notification signal output circuit which, when the alarm signal is output from the alarm signal output circuit, outputs a single protection operation notification pulse;
   wherein the notification signal output circuit, including a NAND gate and an RS type flip-flop circuit, inputs the alarm signal from the alarm signal output circuit into one input side of the NAND gate via a logic inverting circuit and, as well as outputting an output from the NAND gate to an external output terminal, inputs the output into an inverting set terminal of the RS type flip-flop circuit via the logic inverting circuit, thus supplying an inverting output from the RS type flip-flop circuit to another input side of the NAND gate.

5. The semiconductor element drive device according to claim 4, wherein
   the alarm signal output circuit, being configured in such a way as to output a protection signal which causes the protection operation for the semiconductor element when the alarm signal is output, includes a reset circuit which resets the RS type flip-flop circuit of the notification signal output circuit when the protection signal output from the alarm signal output circuit is stopped, and an operation signal for a relevant semiconductor element is in an on condition.

6. The semiconductor element drive device according to claim 5, wherein
   the protection circuits include at least a temperature detection circuit which detects a temperature of the semiconductor elements, an overcurrent detection circuit which detects an overcurrent of the semiconductor elements, and a control voltage detection circuit which detects a control voltage.

7. The semiconductor element drive device according to claim 4, wherein
   the protection circuits include at least a temperature detection circuit which detects a temperature of the semiconductor elements, an overcurrent detection circuit which detects an overcurrent of the semiconductor elements, and a control voltage detection circuit which detects a control voltage.

8. The semiconductor element drive device according to claim 4, wherein
   the protection circuits include at least a temperature detection circuit which detects a temperature of the semiconductor elements, an overcurrent detection circuit which detects an overcurrent of the semiconductor elements, and a control voltage detection circuit which detects a control voltage.

9. A semiconductor element drive device which individually drives semiconductor elements configuring a power converter, comprising:
   a plurality of protection circuits which detect information necessary for carrying out a protection operation for the semiconductor elements;
   an alarm signal output circuit that outputs a pulse signal corresponding to a protection circuit, among the plurality of protection circuits, which has first detected that the protection operation is necessary, as an alarm signal during a period in which it is detected that the protection operation is necessary, the pulse signal having a pulse timing that depends on which of the protection circuits has first detected that the protection operation is necessary; and
   a notification signal output circuit which, when the alarm signal is output from the alarm signal output circuit, outputs a series of pulses as a protection operation notification signal, the pulses of the series maintaining a predetermined interval, wherein the notification signal output circuit, including a NAND gate and an RS type flip-flop circuit, inputs the alarm signal from the alarm signal output circuit into one input side of the NAND gate via a logic inverting circuit and, as well as outputting an output from the NAND gate to an external output terminal, inputs the output into an inverting set terminal of the RS type flip-flop circuit via the logic inverting circuit, thus supplying an inverting output from the RS type flip-flop circuit to another input side of the NAND gate.

10. The semiconductor element drive device according to claim 9, wherein the alarm signal output circuit, being configured in such a way as to output a protection signal which causes the protection operation for the semiconductor element when the alarm signal is output, includes a reset signal formation circuit which resets the RS type flip-flop circuit of the notification signal output circuit when the protection signal output from the alarm signal output circuit is stopped, and an operation signal for a relevant semiconductor element is in an on condition, and a protection operation notification continuation circuit which resets the RS type flip-flop circuit immediately before one pulse's worth of rise of the alarm signal at predetermined time intervals.

11. A device comprising:
a plurality of detection circuits that each detects one of a plurality of distinct circuit conditions and outputs a corresponding detection signal;
an alarm signal output circuit coupled to each of the plurality of detection circuits, that identifies a detection signal from one the plurality of detection circuits and outputs a pulse signal as a corresponding alarm signal; and
a notification signal output circuit that outputs a notification signal having a pulse timing corresponding to a pulse timing of the alarm signal,
wherein the notification signal output circuit applies a logic inverting circuit to the alarm signal.

12. The device of claim 11, further comprising a reset circuit that resets the notification signal output circuit based on a change in the identified detection signal.

13. The device of claim 11, the plurality of detection circuits including a temperature detection circuit that detects an overheating condition, an overcurrent detection circuit that detects an overcurrent condition, and a control voltage detection circuit that detects a low voltage condition.

14. The device of claim 11, wherein the alarm signal is a pulse train and the notification signal has a duration that depends on the first pulse of the pulse train.

15. The device of claim 11, wherein the notification signal output circuit outputs a plurality of notification signals to an external control device.

* * * * *